(12) United States Patent
Green

(10) Patent No.: US 7,952,098 B2
(45) Date of Patent: May 31, 2011

(54) ACTIVE MATRIX ELECTRONIC ARRAY DEVICE

(75) Inventor: Peter W. Green, Eindhoven (NL)

(73) Assignee: TPO Hong Kong Holding Limited, Shatin (HK)

( * ) Notice: Subject to any disclaimer, the term of this patent is extended or adjusted under 35 U.S.C. 154(b) by 521 days.

(21) Appl. No.: 11/629,992

(22) PCT Filed: Jun. 8, 2005

(86) PCT No.: PCT/IB2005/051870
§ 371 (c)(1),
(2), (4) Date: Jun. 11, 2009

(87) PCT Pub. No.: WO2005/124828
PCT Pub. Date: Dec. 29, 2005

(65) Prior Publication Data
US 2009/0272979 A1    Nov. 5, 2009

(30) Foreign Application Priority Data
Jun. 19, 2004  (GB) .................................. 0413749.3

(51) Int. Cl.
*H01L 29/04* (2006.01)
*H01L 31/036* (2006.01)
(52) U.S. Cl. ............................... 257/72; 257/88; 438/22
(58) Field of Classification Search ............ 257/72, 257/88, E33.053; 438/22, 486
See application file for complete search history.

(56) References Cited

U.S. PATENT DOCUMENTS

| 6,232,142 B1 * | 5/2001 | Yasukawa ..................... 438/69 |
| 6,297,080 B1 | 10/2001 | Lee et al. |
| 2003/0085439 A1 | 5/2003 | Gudesen et al. |
| 2006/0154456 A1 * | 7/2006 | Taniguchi et al. ............ 438/487 |
| 2007/0217289 A1 * | 9/2007 | Watabe et al. ................ 367/189 |

FOREIGN PATENT DOCUMENTS

| CN | 1460885 A | 12/2003 |
| EP | 1 017 100 A | 7/2000 |
| EP | 1 365 277 A | 11/2003 |

OTHER PUBLICATIONS

Kaneko Y et al., IEEE Electron Device Letters, IEEE Inc., vol. 24, No. 9, Sep. 2003, pp. 586-588.
T. Sameshima et al., Appl. Phys. A, vol. 73, 2001, pp. 419-423.
T. Sameshima et al., Appl. Phys. A, vol. 74, 2002, pp. 719-723.

* cited by examiner

*Primary Examiner* — Phuc T Dang
(74) *Attorney, Agent, or Firm* — Birch, Stewart, Kolasch & Birch, LLP

(57) ABSTRACT

An active matrix device has an array (54) of device elements, each of which comprises at least one thin film transistor (34). A thin film conductive heater element arrangement (10) is provided over a substrate of the device, and the semiconductor islands of the thin film transistors are provided over the heater element arrangement (10). The heating arrangement can remain in place in the device, thereby avoiding the need to remove the layers of the heater element arrangement during processing.

10 Claims, 3 Drawing Sheets

ACTIVE MATRIX ELECTRONIC ARRAY DEVICE

This application is a National Phase Application under 35 U.S.C. §371 of PCT/IB05/51870 filed Jun. 8, 2005.

BACKGROUND OF THE INVENTION

1. Field of Invention

This invention relates to methods and apparatus for heat treatment of semiconductor films provided over thermally sensitive substrates. In particular, the invention relates to the formation of polycrystalline silicon thin-film transistors on glass substrates for use in liquid crystal displays (LCDs) or organic light emitting diode displays (OLEDs).

2. Related Art

Active matrix liquid crystal displays (LCDs) and organic light emitting diode displays (OLEDS) use active matrix circuits having thin film transistors (TFTs) provided on a glass substrate. There are also proposals to form the active plate of such devices on plastic substrates.

Active matrix LCDs typically use amorphous silicon (a-Si) TFTs, although there has been much recent interest and development of TFTs using polycrystalline silicon (poly-Si). This technology can give superior image resolution, and can also permit integration of peripheral drive circuits onto the substrate of the pixel array. For current-addressed displays, such as OLEDs, poly-Si TFTs provide better current driving capabilities.

The main difficulty in the fabrication of poly-Si devices on current glass substrates is the heat treatment method for forming the crystallized semiconductor layer from a deposited amorphous silicon layer, and the activation of implanted dopants. Glass is easily deformed when exposed to temperatures above 500 degrees Celsius for substantial lengths of time.

Various heat treatment methods have been developed for the crystallization of a deposited amorphous silicon layer.

Solid phase crystallization (SPC) is one common method for crystallizing amorphous silicon. In this process, the amorphous silicon is subject to heat treatments at temperatures approaching 600 degrees Celsius for a period of several hours. This method can lead to damage of the glass substrate. In particular, if low cost glass substrates are to be used, the temperature is too high to be used or else, if the annealing is done at relatively low temperatures, the anneal time is too long.

Laser treatment methods can operate at lower temperatures, for example excimer laser crystallization and metal-induced crystallization. Excimer laser crystallization uses nano-second laser pulses to melt and solidify the amorphous silicon into a crystalline form. Theoretically, this offers the possibility of annealing the amorphous silicon at its optimum temperature without degrading the glass substrate upon which it is mounted. However, this method has critical drawbacks for its use in mass production. The grain structure of poly-Si film through this process is extremely sensitive to the laser beam energy, so that a uniformity in grain structure and hence the device characteristics can not be achieved. Also, the beam size of the laser is relatively small. The small beam size requires multiple laser passes, or shots, to complete the crystallization processes for large size glass. Since it is difficult to control precisely the laser, the multiple shots introduce non-uniformities into the crystallization process.

The metal induced crystallization process involves addition of various metal elements such as Ni, Pd, Au, Ag, and Cu onto amorphous silicon films in order to enhance the crystallization kinetics. Use of this method enables crystallization at low temperatures below 600 degrees Celsius. This method, however, is limited by poor crystalline quality of poly-Si and metal contamination. The metal contamination causes a detrimental leakage current in the operation of poly-Si TFTs. Another problem of this method is the formation of metal silicides during the process.

Heat treatment is also used for activation of dopants during an annealing stage after dopant deposition. Again excimer laser annealing can be used for this purpose, or a so-called rapid thermal anneal process has been proposed. This process uses higher temperatures but for short durations of time. An optical heating source such as tungsten-halogen or Xe Arc lamp is often used as the heat source. This can however result in unwanted excessive heating of the glass substrate.

More recent publications have shown that polysilicon can be formed from amorphous silicon using an integrated metal heater element fabricated above the transistor structure. For example, reference is made to the paper "Polycrystalline Silicon Thin-Film Transistors Fabricated by Rapid Joule Heating Method" of Y. Kaneko et al, IEEE EDL, Vol 24, No. 9, p 586 (2003). Reference is also made to the paper "Rapid crystallization of silicon films using Joule heating of metal films" of T. Sameshima et al, App. Phys. A, A 73, p. 419-423 (2001).

In these proposals, a dielectric layer separates a thin film heater from the amorphous silicon. Current is passed through the heater element in pulses, for example 10 to 100 microseconds, which is sufficient to melt the underlying a-Si. However, the substrate remains cool, so that the process is effectively a low temperature process. The heaters are also used to activate implanted source and drain dopants.

These processes involve the treatment of the amorphous silicon layer by a thin film heating arrangement deposited over the amorphous silicon layer. After the heating process is completed, the layers defining the heating arrangement are removed, and the device is completed in conventional manner.

SUMMARY OF THE INVENTION

According to the invention, there is provided an active matrix electronic array device comprising an array of device elements each comprising at least one thin film transistor. The device comprises a substrate, a thin film conductive heater element arrangement provided over the substrate, an electrically insulating layer provided over the heater element arrangement, and a plurality of thin film layers defining the thin film transistors and provided over the electrically insulating layer. The thin film layers comprises a semiconductor layer, and at least portions of the semiconductor layer defining the thin film transistors are provided over the heater element arrangement.

The device of the invention has a heating arrangement integrated into the structure of the device. As the heating arrangement is provided beneath the device elements, it can remain in place, thereby avoiding the need to remove the layers of the heater element arrangement during processing. This simplifies the manufacturing process. The use of localized heating avoids the need for expensive laser processing techniques.

Retention of the heaters in the completed device can also be used during the lifetime of the device. For example, it has been shown that TFT degradation by hot carrier injection can be reversed (at least partially) by annealing. By heating the TFTs, it may be possible to extend their lifetime and hence that of the array device.

In addition, when making self-aligned low temperature polycrystalline silicon (LTPS) TFTs, the source/drain dopant to channel junction is very abrupt. This abrupt step in doping levels cannot be broadened to any great extent by laser activation of the dopants, as the gate conductor acts as a shield during the laser process. This abrupt change in doping levels leads to high fields at the drain of the TFTs, leading to reduced operating voltages which can be used over the lifetime of the device.

Junction broadening can be achieved by the use of the heater elements of the invention in order to help to reduce the high drain fields and hence, extend upwards the range of operating voltages at which the TFT can be used.

The substrate may comprise a glass or plastics substrate.

Typically, the electrically insulating layer comprises an oxide or nitride layer.

The heater element arrangement may comprise a patterned metal layer, for example a copper or platinum layer. It may comprise a first patterned metal layer patterned into regions for providing local heating and a second patterned electrically conductive and substantially transparent layer for providing electrical connection to the regions of the first patterned metal layer. This enables good electrical connection to be made to the heater element portions while maintaining a transparent substrate (other than at the location of the TFTs). This is appropriate for a transmissive display device.

The semiconductor layer may comprise amorphous silicon. In this case, the heating can be used to improve the lifetime or uniformity of the transistors. The semiconductor layer may preferably comprise polycrystalline silicon, wherein the crystallization has been effected by the heater element arrangement.

The invention can be used in many types of device, including active matrix display devices such as liquid crystal display devices.

The invention also provides a method of fabricating an active matrix electronic array device comprising an array of device elements, each of which comprises at least one thin film transistor. The method comprises the following steps of: forming a thin film conductive heater element arrangement over a substrate, forming an electrically insulating layer over the heater element arrangement, forming one or more layers over the electrically insulating layer, which comprises at least an amorphous silicon semiconductor layer, heating the semiconductor layer to crystallize at least portions of the layer to form polycrystalline silicon, and forming further layers thereby defining the device elements.

The invention also provides a method of operating an active matrix electronic array device comprising an array of device elements, each of which comprises at least one thin film transistor. The method comprises the steps of: during the lifetime of the device after fabrication, performing heating of the thin film transistors using a thin film conductive heater element provided beneath the thin film transistors and integrated into the thin film structure of the device.

In this case, the heating can be performed for reducing voltage threshold drift of amorphous silicon transistors or for trimming thin film transistor characteristics.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

The invention provides an active matrix electronic array device in which a thin film conductive heater element arrangement is provided over the substrate and beneath device elements. This can be used during manufacture for crystallization and/or during use of the device to alter device element characteristics.

Figure 1A:
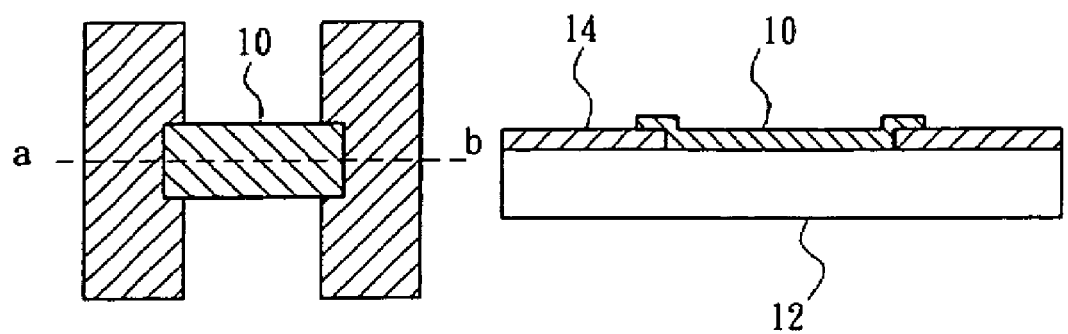
FIG. 1a to FIG. 1c show a manufacturing process in accordance with the invention.
Figure 1B:
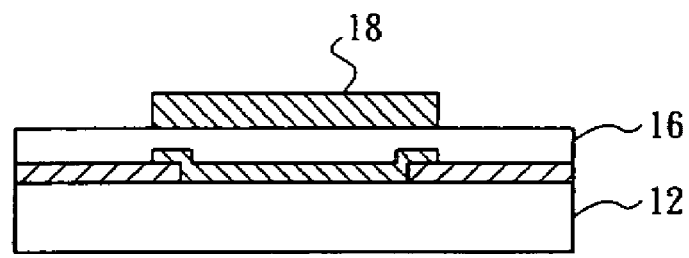
Figure 1C:
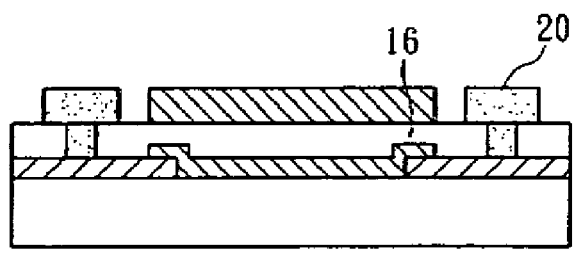

FIG. 1a to FIG. 1c show a manufacturing method in accordance with the invention.

FIG. 1a shows a plan and a cross sectional view of a single heater element 10. The shape of an individual heater element is selected to provide heating of the channel of a respective thin film transistor. An array of heater elements 10 will thus be provided, and they provide high temperature localized heating, which enables the overall heat exposure of the substrate to be within acceptable levels. The heater elements 10 are provided over the device substrate 12.

The heater elements 10 are fabricated from metals such as platinum (Pt) or chromium (Cr). As shown in FIG. 1a, electrical connections 14 are made to opposite ends of the heater element 10, and the material used for the connections 14 does not provide significant heating at the currents required.

As shown in FIG. 1b, an insulating layer 16 is deposited over the heater element arrangement, for example by PECVD, and comprises an oxide or nitride, for example silicon oxide or silicon nitride. The amorphous silicon layer 18 which will define the TFT channels is then deposited over the insulating layer 16.

The amorphous silicon can be patterned to leave islands above the heater elements 10 as shown in FIG. 1b, although the TFT device islands can instead be patterned after crystallization.

As shown in FIG. 1c, electrical contacts 20 are then made down to the connections 14 to enable current to be passed through the heater elements 10.

The sample is then placed into an inert atmosphere and current is passed through the heater elements 10 to form polysilicon. TFT fabrication can then continue with deposition and patterning of the remaining layers i.e. gate oxide, gate metal, ion implantation, in conventional manner.

The heater elements are thus integrated into the structure of the device and they are not removed by subsequent processing, which simplifies the manufacturing process.

Determining the required operation of the heater elements to provide the desired heat transfer to the amorphous silicon layer will be routine to those skilled in the art. A pulsed voltage operation will typically be used. Furthermore, the dimensions (area and thickness) and materials for the heater elements will also be selected using standard considerations.

Figure 2:
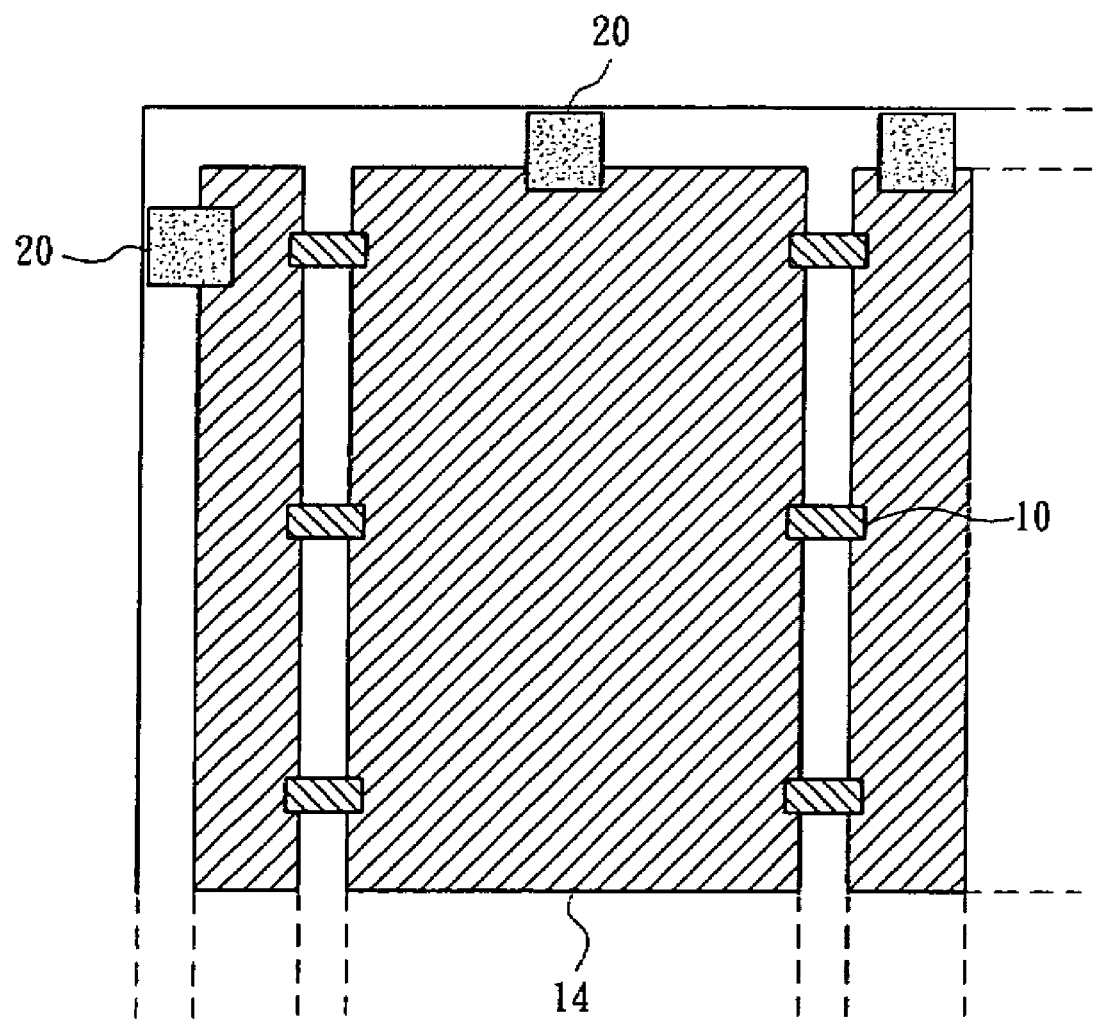
FIG. 2 shows an array of heater elements of the invention.

As mentioned above, an array of heater elements 10 will be provided, and FIG. 2 shows an example of how the array of heater elements can be interconnected.

The example of FIG. 2 is particularly suitable for an active matrix LCD active plate. The heater elements 10 are connected in an array, with the heaters positioned directly below the silicon islands of the active matrix TFTs (not shown). For a transmissive/transflective display, the heater elements are connected using a transparent conductor 14 such as ITO. The ITO provides no significant heating effect, and the heating is localized at the heater elements 10, each of which act on the semiconductor body of a respective TFT.

The use of the heater elements during the manufacturing process has been described above. However, retention of the heaters in the completed device can also be used during the lifetime of the device. For example, it has been shown that TFT degradation by hot carrier injection can be reversed (at least partially) by annealing. By heating the TFTs, it may be possible to extend their lifetime and hence that of the array device.

In addition, when making self-aligned low temperature polycrystalline silicon (LTPS) TFTs, the source/drain dopant to channel junction is very abrupt This abrupt step in doping levels cannot be broadened to any great extent by laser activation of the dopants, as the gate conductor acts as a shield during the laser process. This abrupt change in doping levels leads to high fields at the drain of the TFTs, leading to reduced operating voltages which can be used over the lifetime of the device.

Junction broadening can be achieved by the use of the heater elements of the invention in order to help to reduce the high drain fields and hence, extend upwards the range of operating voltages at which the TFT can be used.

The invention is applicable to the fabrication of LTPS on glass and plastics, for applications such as active matrix display devices but also other array devices, such as image sensors.

The use of the integrated heaters during the lifetime of the device can extend the applicability of the invention to uses where the heater elements are not required for crystallization. For example, the heating of amorphous silicon TFTs can be used to reduce threshold voltage drift.

The localized heating can also be used to trim TFT characteristics, to improve uniformity of device characteristics. For example for mobile displays, the trimming of a-Si or poly-Si TFT characteristics can be performed during battery recharging. This prevents the heater elements using battery power during normal operation.

The dielectric layer 16 will need to withstand the high localized temperatures required for melting the amorphous silicon.

Figure 3:
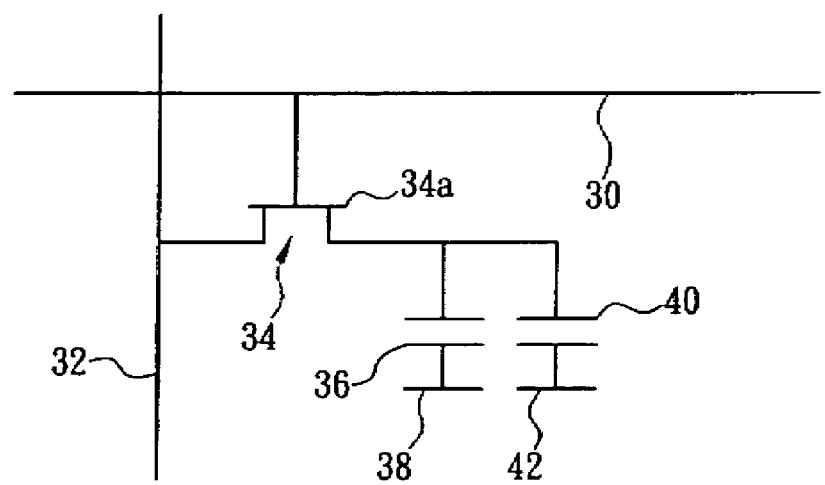
FIG. 3 shows a known pixel design for an active matrix LCD display device.

As mentioned above, the invention can be applied to many different array devices, and active matrix liquid crystal displays are one example. By way of example therefore, FIG. 3 shows a conventional pixel configuration for an active matrix liquid crystal display. The display is arranged as an array of pixels in rows and columns. Each row of pixels shares a common row conductor 30, and each column of pixels shares a common column conductor 32. Each pixel comprises a thin film transistor 34 and a liquid crystal cell 36 arranged in series between the column conductor 32 and a common electrode 38. The transistor 34 is switched on and off by a signal provided on the row conductor 30. The row conductor 30 is thus connected to the gate 34a of each transistor 34 of the associated row of pixels. Each pixel additionally comprises a storage capacitor 40 which is connected at one end 42 to the next row electrode, to the preceding row electrode, or to a separate capacitor electrode.

Figure 4:
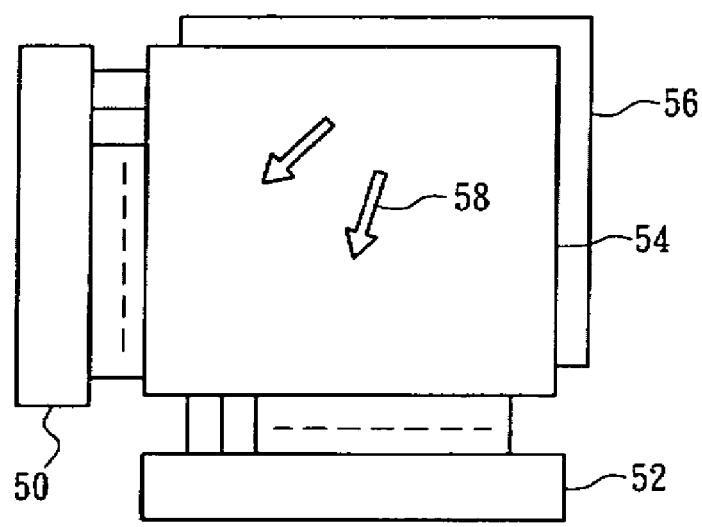
FIG. 4 shows a display device to which the invention may be applied.

As shown in FIG. 4, row address signals are provided by row driver circuitry 50, and pixel drive signals are provided by column address circuitry 52, to the array 54 of display pixels. The display has a backlight 56, and each liquid crystal cell 16 modulates (i.e. variably attenuates) the light from the backlight 56 to change the pixel image brightness (represented by arrows 58) viewed from the opposite side of the array 34 of display pixels. The array 54 constitutes an active matrix display module. Colour filters are used to provide red, green and blue pixels, enabling a colour display device to be formed.

The use of polycrystalline silicon TFTs can enable the integration of the row and/or column driver circuitry onto the same substrate and in the same technology as the pixel array, and this invention provides a low cost process for forming the polycrystalline silicon. Alternatively, the use of amorphous silicon provides a lower cost fabrication process for the pixel array, and the invention can enable the useful lifetime of an amorphous silicon pixel array to be prolonged.

Numerous variations will be apparent to those skilled in the art.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An active matrix electronic array device comprising an array of device elements, wherein each of the device elements comprises at least one thin film transistor, the device comprising:
    a substrate;
    a thin film conductive heater element arrangement provided over the substrate;
    an electrically insulating layer provided over the heater element arrangement; and
    a plurality of thin film layers defining the thin film transistors and provided over the electrically insulating layer, wherein the thin film layers comprises a semiconductor layer, and at least portions of the semiconductor layer defining the thin film transistors are provided over the heater element arrangement,
    wherein the heater element arrangement has a first patterned metal layer patterned into regions for providing local heating and a electrically conductive and substantially transparent layer, for providing electrical connection to the regions of the first patterned metal layer.

2. The device as claimed in claim 1, wherein the substrate comprises a glass substrate.

3. The device as claimed in claim 1, wherein the substrate comprises a plastics substrate.

4. The device as claimed in claim 1, wherein the electrically insulating layer comprises an oxide or nitride layer.

5. The device as claimed in claim 1, wherein the heater element arrangement comprises a patterned metal layer.

6. The device as claimed in claim 5, wherein the metal layer comprises a copper or platinum layer.

7. The device as claimed in claim 1, wherein the semiconductor layer comprises amorphous silicon.

8. The device as claimed in claim 1, wherein the semiconductor layer comprises polycrystalline silicon, and the crystallization has been effected by the heater element arrangement.

9. The device as claimed in claim 1, comprising an active matrix display device.

10. The device as claimed in claim 9, comprising an active matrix liquid crystal display device.

* * * * *